(12) United States Patent
Sarpatwari et al.

(10) Patent No.: US 11,545,216 B2
(45) Date of Patent: *Jan. 3, 2023

(54) MITIGATION OF VOLTAGE THRESHOLD DRIFT ASSOCIATED WITH POWER DOWN CONDITION OF NON-VOLATILE MEMORY DEVICE

(71) Applicant: Micron Technology, Inc., Boise, ID (US)

(72) Inventors: Karthik Sarpatwari, Boise, ID (US); Fabio Pellizzer, Boise, ID (US); Jessica Chen, Boise, ID (US); Nevil Gajera, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/165,555

(22) Filed: Feb. 2, 2021

(65) Prior Publication Data
US 2021/0233584 A1 Jul. 29, 2021

Related U.S. Application Data

(63) Continuation of application No. 16/544,669, filed on Aug. 19, 2019, now Pat. No. 10,943,657.

(51) Int. Cl.
*G11C 13/00* (2006.01)

(52) U.S. Cl.
CPC ...... *G11C 13/0069* (2013.01); *G11C 13/0004* (2013.01); *G11C 13/0038* (2013.01)

(58) Field of Classification Search
CPC .......... G11C 13/0069; G11C 13/0004; G11C 13/0038
See application file for complete search history.

(56) References Cited

U.S. PATENT DOCUMENTS

| 8,169,825 B1 | 5/2012 | Shalvi et al. |
| 9,558,823 B1 | 1/2017 | Khwa et al. |

(Continued)

FOREIGN PATENT DOCUMENTS

| CN | 109564767 A | 4/2019 |
| CN | 109643573 A | 4/2019 |

OTHER PUBLICATIONS

China National Intellectual Property Administration, "First Office Action," issued in connection with Chinese Application No. 202010782092.9, dated Jul. 2, 2021 (4 pages).

*Primary Examiner* — Mushfique Siddique
(74) *Attorney, Agent, or Firm* — Holland & Hart LLP

(57) ABSTRACT

Methods, systems, and devices for dirty write on power off are described. In an example, the described techniques may include writing memory cells of a device according to one or more parameters (e.g., reset current amplitude), where each memory cell is associated with a storage element storing a value based on a material property associated with the storage element. Additionally, the described techniques may include identifying, after writing the memory cells, an indication of power down for the device and refreshing, before the power down of the device, a portion of the memory cells based on identifying the indication of the power down for the device. In some cases, refreshing includes modifying at least one of the one or more parameters for a write operation for the portion of the memory cells.

23 Claims, 9 Drawing Sheets

(56) References Cited

U.S. PATENT DOCUMENTS

| | | | |
|---|---|---|---|
| 2006/0158948 A1* | 7/2006 | Fuji | G11C 13/0069 365/222 |
| 2007/0253238 A1 | 11/2007 | Resta et al. | |
| 2009/0067229 A1* | 3/2009 | Kang | G11C 13/003 365/171 |
| 2010/0027314 A1 | 2/2010 | Chevallier et al. | |
| 2014/0006688 A1 | 1/2014 | Yu et al. | |
| 2017/0329389 A1 | 11/2017 | Kim et al. | |
| 2018/0040363 A1* | 2/2018 | Kwon | G11C 11/406 |
| 2019/0391759 A1* | 12/2019 | Kang | G11C 13/0004 |

* cited by examiner

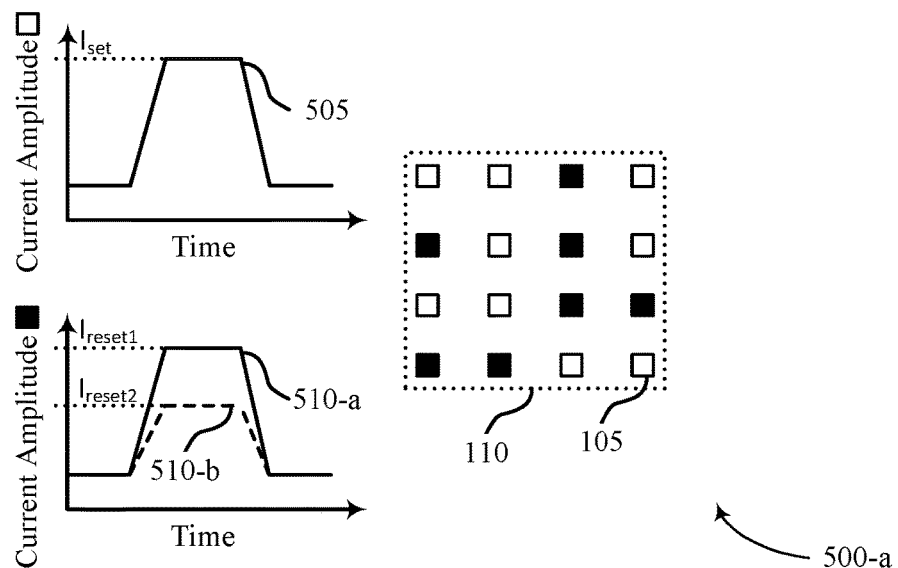
FIG. 5A
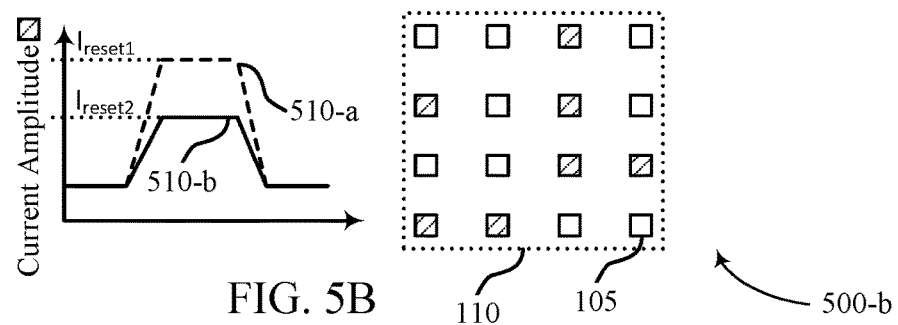
FIG. 5B
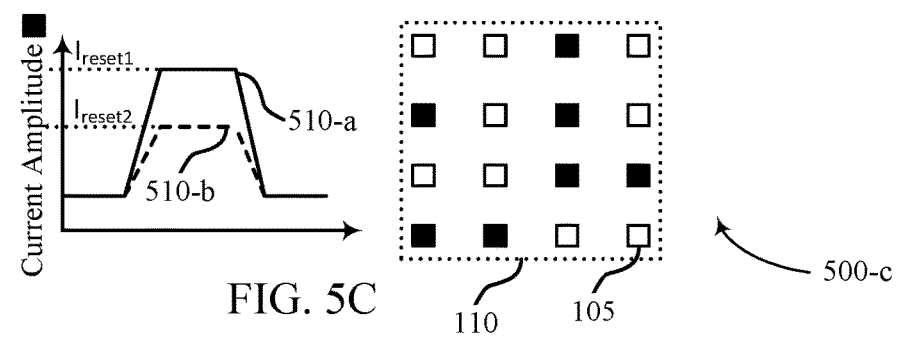
FIG. 5C
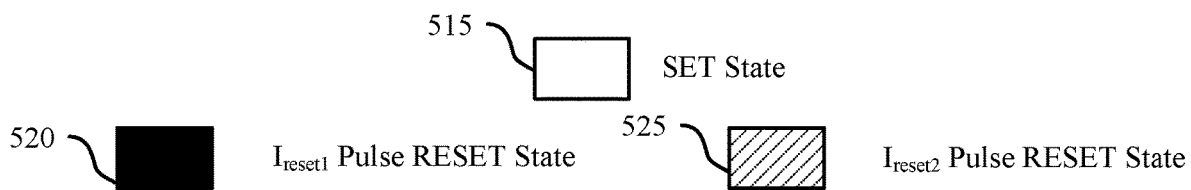

MITIGATION OF VOLTAGE THRESHOLD DRIFT ASSOCIATED WITH POWER DOWN CONDITION OF NON-VOLATILE MEMORY DEVICE

CROSS REFERENCE

The present Application for Patent is a continuation of U.S. patent application Ser. No. 16/544,669 by Sarpatwari et al., entitled "MITIGATION OF VOLTAGE THRESHOLD DRIFT ASSOCIATED WITH POWER DOWN CONDITION OF NON-VOLATILE MEMORY DEVICE," filed Aug. 19, 2019, assigned to the assignee hereof, and is expressly incorporated by reference in its entirety herein.

BACKGROUND

The following relates generally to a system that includes at least one memory device and more specifically to enhancing memory device performance in environments subject to power cycling.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Improving memory devices may include increasing memory cell density, increasing read/write speeds, increasing reliability, increasing data retention, reducing power consumption, or reducing manufacturing costs, among other metrics. In some applications, material characteristics or responsive behaviors of memory cells may change over time or in the presence of power cycling, which may affect performance of a memory device.

BRIEF DESCRIPTION OF THE DRAWINGS

FIGS. 5A, 5B, and 5C illustrate examples of write pulse operations for enhancing memory device performance in environments subject to power cycling in accordance with examples as disclosed herein.

DETAILED DESCRIPTION

Figure 1:
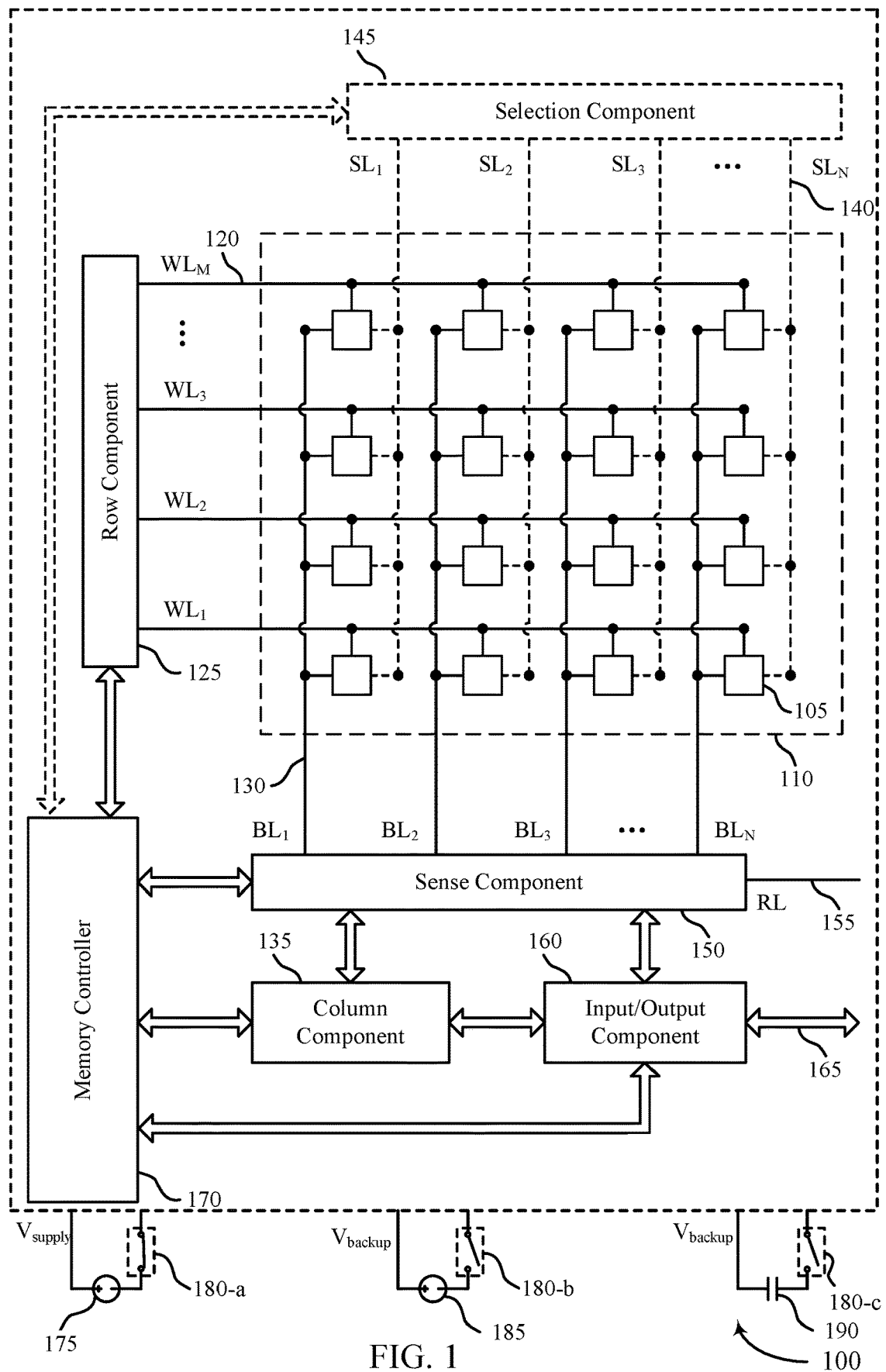
FIG. 1 illustrates an example of a memory device that supports enhancing memory device performance in environments subject to power cycling in accordance with examples as disclosed herein.

In some memory devices, a memory cell architecture may store a logic state in a configurable material (e.g., in a physical characteristic or property of the material), such as a chalcogenide. For example, different material characteristics or properties of a material may be configurable based on portions of a write or refresh operation, and differences in the material characteristics or properties may be detected during a read operation to distinguish whether a memory cell was written with one logic state or another (e.g., a logic 0 or a logic 1). In some cases, the material may be configurable to change phase between an amorphous state (e.g., a RESET state) and a crystalline state (e.g., a SET state).

In some examples, a logic state stored by a configurable material may be based on one or more parameters, such as a polarity or amplitude of a voltage across the configurable material or a direction or amplitude of a current across the configurable material during a write or refresh operation. For example, the stored logic state may be based on compositional migration or segregation in a given memory cell, where some constituents (e.g., ions, elements, compounds) of the material migrate towards a positively-biased node or electrode of the memory cell, or some constituents of the material migrate towards a negatively-biased node or electrode of the memory cell, or both. Thus, in some examples, a particular compositional distribution of a configurable material (e.g., an anisotropy between nodes) corresponding to a logic state may be encouraged during a write or refresh operation based at least in part on a voltage polarity between the nodes of the memory cell. In some examples, a logic state stored by a configurable material may be based at least in part on a direction of current applied through a configurable material during a write or refresh operation, or a combination of a polarity of a voltage across the configurable material and a direction of current applied through a configurable material during a write or refresh operation.

In some examples, the polarity used for programming may be accompanied by a particular behavior or characteristic of a configurable material, such as a threshold voltage of the material, which may be used to detect a logic state stored by the memory cell (e.g., in a read operation). For example, one polarity of a write or refresh operation may be associated with a relatively high threshold voltage of the configurable material (e.g., for a particular read operation, for a particular read voltage), whereas another polarity of a write or refresh operation may be associated with a relatively low threshold voltage of the configurable material (e.g., for the particular read operation, for the particular read voltage). In such examples, a presence or absence of current through the material in response to a read voltage applied across the material may be used to determine (e.g., distinguish) whether the memory cell was written with one polarity or another, thereby providing an indication of the logic state that was written to the memory cell.

In some memory applications, the threshold voltage of a memory cell in a RESET state may migrate or drift over time to a higher voltage. If the threshold voltage migrates beyond a retention threshold, the memory cell may no longer be capable of, have significant delays in, or involve utilizing significant amounts of energy in changing to a SET state when a programming voltage or current associated with programming the SET state is applied to the memory cell.

To mitigate voltage threshold drift, a memory device, upon identifying an internal or external indication of power down of the memory device, may perform a refresh operation on memory cells in the RESET state with modified parameters. For instance, the amplitude of the current applied through the configurable material may be reduced as compared to the amplitude of the current for a write operation or refresh operation performed before identifying the indication to power down. After performing the refresh operation with the modified parameters, the memory device may power down. Upon powering back up, the memory device may perform another refresh operation on the memory cells in the RESET state, but may do so with the original parameters. For instance, the amplitude of the current applied to the memory cells may be approximately the same as the amplitude of the current applied in write operations or in refresh operations performed before identifying the indication of power down. By performing a refresh operation with the modified parameters before powering down and/or performing the refresh operation with the original parameters after powering up, the threshold voltage of the memory cells in the RESET state may decrease or may increase to a smaller extent as compared to not performing the refresh operation with the modified parameters before powering down.

Features of the disclosure are initially described in the context of a memory system and circuitry with reference to FIG. 1. Features of the disclosure are described in the context of threshold voltage drift plots and dirty write processes as described with reference to FIGS. 2-5. These and other features of the disclosure are further illustrated by and described with reference to an apparatus diagram and flowcharts that relate to dirty write on power off as described with references to FIGS. 6-9.

FIG. 1 illustrates an example of a memory device 100 that supports enhancing memory device performance in environments subject to power cycling in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, which may be denoted as a logic 0 and a logic 1. In some cases, a memory cell 105 may be programmable to store more than two logic states. In the example of memory device 100, different logic states may be programmed by writing memory cells 105 having configurable material characteristics or material properties that correspond to different logic states, where such material characteristics or material properties (e.g., material states) may be detected during a subsequent read operation to identify a stored logic state. Generally, each memory cell 105 may be comprised of a phase change material or a chalcogenide material.

The set of memory cells 105 may be part of a memory section 110 of the memory device 100 (e.g., including an array of memory cells 105), where, in some examples, a memory section 110 may refer to a contiguous tile of memory cells 105 (e.g., a contiguous set of elements of a semiconductor chip), or a set or bank of more than one contiguous tile of memory cells. In some examples, a memory section 110 or a memory tile may refer to the smallest set of memory cells 105 that may be biased in an access operation, or a smallest set of memory cells 105 that share a common node (e.g., a common source node, a common source plate, a set of source lines that are biased to a common voltage). Although a single memory section 110 of the memory device 100 is shown, various examples of a memory device in accordance with the present disclosure may have multiple memory sections 110. In one illustrative example, a memory device 100, or a subsection thereof (e.g., a core of a multi-core memory device 100, a chip of a multi-chip memory device) may include 32 "banks" and each bank may include 32 sections. Thus, a memory device 100, or subsection thereof, according to the illustrative example may include 1,024 memory sections 110.

In the example of memory device 100, a memory cell 105 may include or otherwise be associated with a configurable material, which may be referred to as a memory element, a memory storage element, a material element, a material memory element, a material portion, a polarity-written material portion, and others. The configurable material may have one or more variable and configurable characteristics or properties (e.g., material states) that are representative of (e.g., correspond to) different logic states. For example, a configurable material may take different forms, different atomic configurations, different degrees of crystallinity, different atomic distributions, or otherwise maintain different characteristics. In some examples, such characteristics may be associated with different electrical resistances, different threshold voltages, or other properties that are detectable or distinguishable during a read operation to identify a logic state stored by the configurable material.

In some examples, a characteristic or property of such a material may be configurable based at least in part on a polarity of a voltage (e.g., an orientation of an electric field) across the material during a write operation. For example, the configurable material may be associated with different electrical resistances or threshold characteristics depending on a polarity of a voltage during the write operation. In one example, a state of the configurable material after a write operation with a positive voltage polarity may have a relatively low electrical resistance or threshold voltage (e.g., corresponding to a "SET" material state, which may correspond to a logic 0), whereas a state of the material after a write operation with a negative voltage polarity may have a relatively high electrical resistance or threshold voltage (e.g., corresponding to a "RESET" material state, which may correspond to a logic 1). In some cases, a relatively high or low resistance or threshold voltage of a written memory cell 105 may be associated with or be otherwise based at least in part on a polarity of a voltage applied during a read operation. For example, a configurable material of a memory cell 105 having a relatively high or low resistance or threshold voltage may be dependent on whether a read operation performed on the memory cell 105 has a same polarity, or a different polarity (e.g., an opposite polarity), as a preceding write operation.

In some cases, a configurable material of a memory cell 105 may be associated with a threshold voltage, which may depend on the polarity of a write operation. For example, electrical current may flow through the configurable material when a voltage greater than the threshold voltage is applied across the memory cell 105, and electrical current may not flow through the configurable material, or may flow through the configurable material at a rate below some level (e.g., according to a leakage rate), when a voltage less than the threshold voltage is applied across the memory cell 105. Thus, a voltage applied to memory cells 105 may result in different current flow, or different perceived resistance, depending on whether a configurable material portion of the memory cell 105 was written with a positive polarity or a negative polarity. Accordingly, the magnitude of current, or other characteristic (e.g., resistance breakdown behavior, snapback behavior) associated with the current, that results from applying a read voltage to the memory cell 105 may be used to determine a logic state stored by memory cell 105.

In the example of memory device 100, each row of memory cells 105 of the memory section 110 may be coupled with one of a set of first access lines 120 (e.g., a word line (WL), such as one of WL1 through WLM), and each column of memory cells 105 may be coupled with one of a set of second access lines 130 (e.g., a bit line (BL), such as one of BL1 through BLN). The plurality of first access lines 120 may be coupled with a row component 125, which may control various operations such as activating or biasing one or more of the plurality of first access lines 120, or selectively coupling one or more of the plurality of first access lines 120 with a voltage source, current source, or other circuit element. The plurality of second access lines 130 may be coupled with a sense component 150, which may support the detection of logic states stored by memory cells 105. In some examples, a sense component 150 may be in communication with a column component 135, or may include or be otherwise co-located with a column component 135, where a column component 135 may control various operations such as activating or biasing one or more of the plurality of second access lines 130, or selectively coupling one or more of the plurality of second access lines 130 with a voltage source, current source, or other circuit element. In some cases, first access lines 120 and second access lines 130 may be substantially perpendicular to one another in the memory device 100 (e.g., when viewing a plane of a deck, layer, or level of the memory device 100, as shown in FIG. 1). References to word lines and bit lines, or their analogues, are interchangeable without loss of understanding or operation.

In general, one memory cell 105 may be located at the intersection of (e.g., coupled with, coupled between) a first access line 120 and a second access line 130. This intersection, or an indication of this intersection, may be referred to as an address of a memory cell 105. A target or selected memory cell 105 may be a memory cell 105 located at the intersection of a biased or otherwise selected first access line 120 and a biased or otherwise selected second access line 130. In other words, a first access line 120 and a second access line 130 may be biased or otherwise selected to access (e.g., read, write, rewrite, refresh) a memory cell 105 at their intersection. Other memory cells 105 that are not at the intersection of a target memory cell 105 may be referred to as non-target or non-selected memory cells 105.

In some examples, the memory cells 105 of the memory section 110 may also be coupled with one of a plurality of third access lines 140 (e.g., a selection line (SL), such as one of SL1 through SLN). The plurality of third access lines 140 may be coupled with a selection component 145, which may control various operations such as activating or biasing one or more of the plurality of third access lines 140, or selectively coupling one or more of the plurality of third access lines 140 with a voltage source, current source, or other circuit element. In some examples, a third access line 140 may be coupled with a cell selection component (e.g., a transistor, a switching component) associated with respective memory cells 105, where such a cell selection component may be configured to selectively couple the memory cell 105 with an associated first access line 120, or associated second access line 130, or selectively permit or suppress current flow through the respective memory cell 105 (e.g., between a first access line 120 and a second access line 130).

Although the plurality of third access lines 140 of the memory device 100 are shown as being parallel with the plurality of second access lines 130, in other examples, a plurality of third access lines 140 may be parallel with the plurality of first access lines 120, or in any other configuration. For example, in the example of memory device 100, each of the third access lines 140 may correspond to a respective one of the second access lines 130. In another example, each of the third access lines 140 may correspond to a respective one of the first access lines 120. In another example, cell selection operations (e.g., biasing a cell selection line, activating cell selection components of one or more memory cells 105), where implemented, may be performed or otherwise supported by the row component 125 (e.g., for selecting or activating cell selection components of a row or page of memory cells 105), and the selection component 145 may be replaced by, or otherwise perform operations related to a source driver for biasing third access lines 140, which may correspond to individually-controllable source lines, a common source plate, or a common source node.

In other examples, the third access lines 140 and the selection component 145 may be omitted from a memory device 100, and accessing memory cells 105 may rely on self-selecting properties of the memory cells 105. For example, the row component 125 and the column component 135 may support fully-decoded operations, where each of the first access lines 120 and each of the second access lines 130 may be individually biased (e.g., in a cross-point configuration). In such examples, accessing memory cells 105 may rely on a self-selecting characteristic of a target memory cell 105 that may be activated based on a voltage, between an activated first access line 120 and activated second access line 130 associated with the target memory cell 105, exceeding a threshold voltage. In various examples, such a self-selecting characteristic may be supported by the logic-storing configurable material element of a memory cell 105, or may be supported by a material portion of a memory cell 105 that is different from a logic-storing portion.

In some examples, a first access line 120 may provide access to one area (e.g., one side, one end) of the configurable material portion of a memory cell 105, and a second access line 130 may provide access to another area (e.g., a different side, an opposite side, an opposite end) of the configurable material portion of the memory cell 105. For example, first access lines 120 may be located above the memory cells 105 (e.g., relative to a substrate) and second access lines 130 may be located below the memory cells 105 (e.g., relative to the substrate), or vice versa. Thus, a first access line 120 and a second access line 130 may support applying voltage or current across a configurable material portion of a memory cell 105 with different polarities (e.g., a first polarity when a voltage of a first access line 120 is higher than a voltage of a second access line 130, a second polarity when a voltage of a first access line 120 is lower than a voltage of a second access line 130). Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein.

Access operations such as reading, writing, rewriting, and refreshing may be performed on a memory cell 105 by activating or selecting a first access line 120, a second access line 130, or a third access line 140 (e.g., where present) that are coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, silicon (e.g., polycrystalline or amorphous) or other conductive or semi-conductive materials, alloys, or compounds. Upon selecting a memory cell 105, a resulting signal (e.g., a cell access signal, a cell read signal) may be used to determine the logic state stored by the memory cell 105. For example, a memory cell 105 with a configurable material portion storing a logic state may be read by applying a read voltage or bias across the memory cell 105, and the resulting flow of current via an access line (e.g., via a second access line 130), or lack thereof, or other characteristic of current flow may be detected, converted, or amplified to determine the programmed logic state stored by the memory cell 105.

Accessing memory cells 105 may be controlled through a row component 125 (e.g., a row decoder), a column component 135 (e.g., a column decoder), or a selection component 145 (e.g., a cell selection driver or a source driver, when included in a memory device 100), or a combination thereof. For example, a row component 125 may receive a row address from the memory controller 170 and select, activate, or bias the appropriate first access line 120 based on the received row address. Similarly, a column component 135 may receive a column address from the memory controller 170 and select, activate, or bias the appropriate second access line 130. Thus, in some examples, a memory cell 105 may be accessed by selecting or activating a first access line 120 and a second access line 130. In various examples, any one or more of the row component 125, the column component 135, or the selection component 145 may be referred to as, or otherwise include access line drivers, access line decoders, access line multiplexers, or other circuitry.

In some examples, the memory controller 170 may control the operation (e.g., read operations, write operations, rewrite operations, refresh operations) of memory cells 105 through the various components (e.g., a row component 125, a column component 135, selection component 145, a sense component 150). In some cases, one or more of a row component 125, a column component 135, a selection component 145, or a sense component 150 may be co-located or otherwise considered to be included with the memory controller 170. In some examples, one or more of a row component 125, a column component 135, or the sense component 150 may be otherwise co-located (e.g., in common circuitry, in a common portion of the memory device 100). In some examples, any one or more of a row component 125, a column component 135, or a selection component 145 may be referred to as a memory controller or circuitry for performing access operations of the memory device 100. In some examples, any one or more of a row component 125, a column component 135, or a selection component 145 may be described as controlling or performing operations for accessing a memory device 100, or controlling or performing operations for accessing the memory section 110 of the memory device 100.

The memory controller 170 may generate row and column address signals to activate a target first access line 120 and a target second access line 130. The memory controller 170 may also generate or control various voltages or currents used during the operation of memory device 100. Although a single memory controller 170 is shown, a memory device 100 may have more than one memory controller 170 (e.g., a memory controller 170 for each of a set of memory sections 110 of a memory device 100, a memory controller 170 for each of a quantity of subsets of memory sections 110 of a memory device 100, a memory controller 170 for each of a set of chips of a multi-chip memory device 100, a memory controller 170 for each of a set of banks of a multi-bank memory device 100, a memory controller 170 for each core of a multi-core memory device 100, or any combination thereof), where different memory controllers 170 may perform the same functions or different functions.

Although the memory device 100 is illustrated as including a single row component 125, a single column component 135, and a single selection component 145, other examples of a memory device 100 may include different configurations to accommodate a memory section 110 or a set of memory sections 110. For example, in various memory devices 100 a row component 125 may be shared among a set of memory sections 110 (e.g., having subcomponents common to all of the set of memory sections 110, having subcomponents dedicated to respective ones of the set of memory sections 110), or a row component 125 may be dedicated to one memory section 110 of a set of memory sections 110. Likewise, in various memory devices 100, a column component 135 may be shared among a set of memory sections 110 (e.g., having subcomponents common to all of the set of memory sections 110, having subcomponents dedicated to respective ones of the set of memory sections 110), or a column component 135 may be dedicated to one memory section 110 of a set of memory sections 110.

A configurable material of a memory cell 105 may be set or written or refreshed by biasing various combinations of the associated first access line 120, second access line 130, or third access line 140 (e.g., via a memory controller 170). In other words, a logic state may be stored in the configurable material of a memory cell 105 (e.g., via a cell access signal, via a cell write signal). A row component 125, a column component 135, or a selection component 145 may accept data, for example, via input/output component 160, to be written to the memory cells 105. In some examples, a write operation may be performed at least in part by a sense component 150, or a write operation may be configured to bypass a sense component 150 (e.g., being performed by a column component 135). The configurable material of a memory cell 105 may be written with a logic state that is based at least in part on a polarity of a write voltage across the memory cell 105, which, in some examples, may be accompanied by a write current (e.g., based at least in part on the write voltage, driven by a current source).

A configurable material of a memory cell 105 may be read (e.g., sensed) by a sense component 150 when the memory cell 105 is accessed (e.g., in cooperation with the memory controller 170) to determine a logic state stored by the memory cell 105. For example, the sense component 150 may be configured to sense a current or charge through the memory cell 105, or a voltage resulting from coupling the memory cell 105 with the sense component 150 or other intervening component (e.g., a signal development component between the memory cell 105 and the sense component 150), responsive to a read operation. The sense component 150 may provide an output signal indicative of (e.g., based at least in part on) the logic state stored by the memory cell 105 to one or more components (e.g., to the column component 135, the input/output component 160, the memory controller 170). In some examples, the detected logic state may be provided to a host device (e.g., a device that uses the memory device 100 for data storage, a processor coupled with the memory device 100 in an embedded application), where such signaling may be provided directly from the input/output component (e.g., via I/O line 165) or via the memory controller 170. In various memory devices 100, a sense component 150 may be shared among a set or bank of memory sections 110 (e.g., having subcomponents common to all of the set or bank of memory sections 110, having subcomponents dedicated to respective ones of the set or bank of memory sections 110), or a sense component 150 may be dedicated to one memory section 110 of a set or bank of memory sections 110.

During or after accessing a memory cell 105, the configurable material portion of a memory cell 105 may or may not permit electrical charge or current to flow via its corresponding access lines 120 or 130 (e.g., in response to a read voltage). Such charge or current may result from biasing, or applying a voltage, to the memory cell 105 from one or more voltage sources or supplies (not shown) of the memory device 100, where voltage sources or supplies may be part of a row component 125, a column component 135, a sense component 150, a memory controller 170, or some other component (e.g., a biasing component). In some examples (e.g., in a memory architecture that includes cell selection components), the described biasing may be supported by an activation of a cell selection component of a target memory cell 105, a deactivation of a cell selection component of a non-target memory cell 105, or both.

In some examples, when a read bias (e.g., a read pulse, a read current, a read voltage) is applied across a memory cell 105 with a configurable material storing a first logic state (e.g., a "SET" material state, associated with a first write polarity), the memory cell 105 may conduct current due to the read bias exceeding a threshold voltage of the memory cell 105. In response to, or based at least in part on this, the sense component 150 may therefore detect a current through the memory cell 105 (e.g., via a second access line 130) as part of determining the logic state stored by the memory cell 105. When a read bias is applied to the memory cell 105 with the configurable material storing a second logic state (e.g., a "RESET" material state, associated with a second write polarity different than the first write polarity), the memory cell 105 may not conduct current due to the read bias not exceeding the threshold voltage of the memory cell 105. The sense component 150 may therefore detect little or no current through the memory cell 105 as part of determining the stored logic state.

In some examples, a reference current may be defined for sensing the logic state stored by a memory cell 105. The reference current may be set above a current that passes through the memory cell 105 when the memory cell 105 does not threshold in response to the read bias, but equal to or below an expected current through the memory cell 105 when the memory cell 105 does threshold in response to the read bias. For example, the reference current may be higher than a leakage current of the associated access lines 120 or 130 (e.g., higher than a leakage current associated with one or more memory cells 105 coupled with an access line 120 or 130 that is common with a target memory cell 105). In some examples, a logic state stored by a memory cell 105 may be determined based at least in part on a voltage (e.g., across a shunt resistance) resulting from the current driven by a read pulse. For example, the resulting voltage may be compared relative to a reference voltage (e.g., as generated within the sense component 150 or provided via a reference line (RL) 155), with a resulting voltage less than the reference voltage corresponding to a first logic state and a resulting voltage greater than the reference voltage corresponding to a second logic state.

In some examples, more than one voltage or current may be applied when reading a memory cell 105 (e.g., multiple voltages may be applied during portions of a read operation). For example, if an applied read voltage does not result in current flow, one or more other read voltages or voltage polarities may be applied (e.g., until a current is detected by sense component 150). Based at least in part on assessing the read voltage that resulted in current flow, the stored logic state of the memory cell 105 may be determined. In some cases, a read voltage or current may be ramped (e.g., smoothly increasing higher in magnitude) until a current flow or other condition is detected by a sense component 150. In other cases, predetermined read voltages may be applied (e.g., a predetermined sequence of read voltages that increase higher in magnitude in a stepwise manner, a predetermined sequence of read voltages that include different read voltage polarities) until a current is detected. Likewise, a read current may be applied to a memory cell 105 and the magnitude or polarity of the voltage to create the read current may depend on the electrical resistance or the total threshold voltage of the memory cell 105.

A sense component 150 may include various switching components, selection components, multiplexers, transistors, amplifiers, capacitors, resistors, voltage sources, current sources, or other components to detect, convert, or amplify a difference in sensing signals (e.g., a difference between a read voltage and a reference voltage, a difference between a read current and a reference current), which, in some examples, may be referred to as latching or generating a latch signal. In some examples, a sense component 150 may include a collection of components (e.g., circuit elements, circuitry) that are repeated for each of a set of second access lines 130 connected to the sense component 150. For example, a sense component 150 may include a separate sensing circuit or circuitry (e.g., a separate sense amplifier, a separate signal development component) for each of a set of second access lines 130 coupled with the sense component 150, such that a logic state may be separately detected for a respective memory cell 105 coupled with a respective one of the set of second access lines 130. In some examples, a reference signal source (e.g., a reference component) or generated reference signal may be shared between components of the memory device 100 (e.g., shared among one or more sense components 150, shared among separate sensing circuits of a sense component 150, shared among access lines 120 or 130 of a memory section 110).

In some memory architectures, accessing a memory cell 105 may degrade or destroy a logic state stored by one or more memory cells 105 of the memory section 110, and rewrite or refresh operations may be performed to return the original logic state to the memory cells 105. In architectures that include a configurable material portion for logic storage, for example, sense operations may cause a change in the atomic configuration or distribution of a memory cell 105, thereby changing the resistance or threshold characteristics of the memory cell 105. Thus, in some examples, the logic state stored in a memory cell 105 may be rewritten after an access operation.

In some examples, reading a memory cell 105 may be non-destructive. That is, the logic state of the memory cell 105 may not need to be rewritten after the memory cell 105 is read. For example, in architectures that include a configurable material portion for logic storage, sensing the memory cell 105 may not destroy the logic state and, thus, a memory cell 105 may not need rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write or refresh pulse or bias to maintain or rewrite stored logic states. Refreshing a memory cell 105 may reduce or eliminate read disturb errors or logic state corruption due to a change in composition distribution of a configurable logic storage material over time.

In some cases, material characteristics, material properties, or responsive behaviors of a configurable material associated with the memory cells 105 may change or migrate over time (e.g., due to aging, wear, degradation, compositional changes, or migrations, or other changes). For instance, voltage thresholds for memory cells 105 in a RESET state may increase until the voltage thresholds are above a retention threshold. Upon reaching the retention threshold, memory cells 105 that receive a write pulse for programming the memory cells 105 to a SET state may not transition from the RESET state to the SET state.

To mitigate voltage threshold drift, memory device 100, upon identifying an internal or external indication of power down, may perform a refresh operation on memory cells 105 in the RESET state with modified parameters. For instance, the amplitude of the current applied through the configurable material may be reduced as compared to the amplitude of the current for a write operation or refresh operation performed before identifying the indication of power down. After performing the refresh operation with the modified parameters, memory device 100 may power down. Upon powering back up, memory device 100 may perform another refresh operation on the memory cells in the RESET state, but may do so with the original parameters. For instance, the amplitude of the current applied to the memory cells 105 may be approximately the same as the amplitude of the current applied in write operations or in refresh operations performed before identifying the indication of power down. By performing a refresh operation with the modified parameters before powering down and/or performing the refresh operation with the original parameters after powering up, the threshold voltage of the memory cells 105 in the RESET state may decrease or may increase to a smaller extent as compared to not performing the refresh operation with the modified parameters before powering down.

In some cases, one or more components of memory device 100 (e.g., the memory array) may be selectively coupled with a supply voltage source 175 (e.g., via switch 180-a) which may supply voltage $V_{supply}$. Additionally or alternatively, one or more components of memory device 100 may be selectively coupled with secondary or back-up voltage source 185 (e.g., via switch 180-b) and/or capacitor 190 (e.g., via switch 180-c), either of which may supply $V_{backup}$. Capacitor 190 may be, for example, a supercapacitor capable of supplying sufficient power to complete the refresh operation after the main power supply (e.g., line power or battery power) is removed for the system. In some cases, memory device 100 may be coupled with capacitor 190 via a voltage converter (e.g., capacitor 190 may store a voltage higher than the supply voltage to memory device 100). Generally, one or more of memory cells 105, memory section 110, row component 125, column component 135, input/output component 160, memory controller 170, sense component 150, or selection component 145 may be selectively coupled with supply voltage source 175, back-up voltage source 185, capacitor 190, or a combination thereof. In some examples, supply voltage source 175 may be coupled with the one or more components of memory device 100 when the memory device 100 is powered up and may be isolated from the one or more components when the memory device 100 is powered down. In some examples, back-up voltage source 185 and/or capacitor 190 may be coupled with the one or more components of memory device 100 when power down of the memory device 100 is detected and may be isolated from the one or more components when the memory device 100 is powered on.

Figure 2:
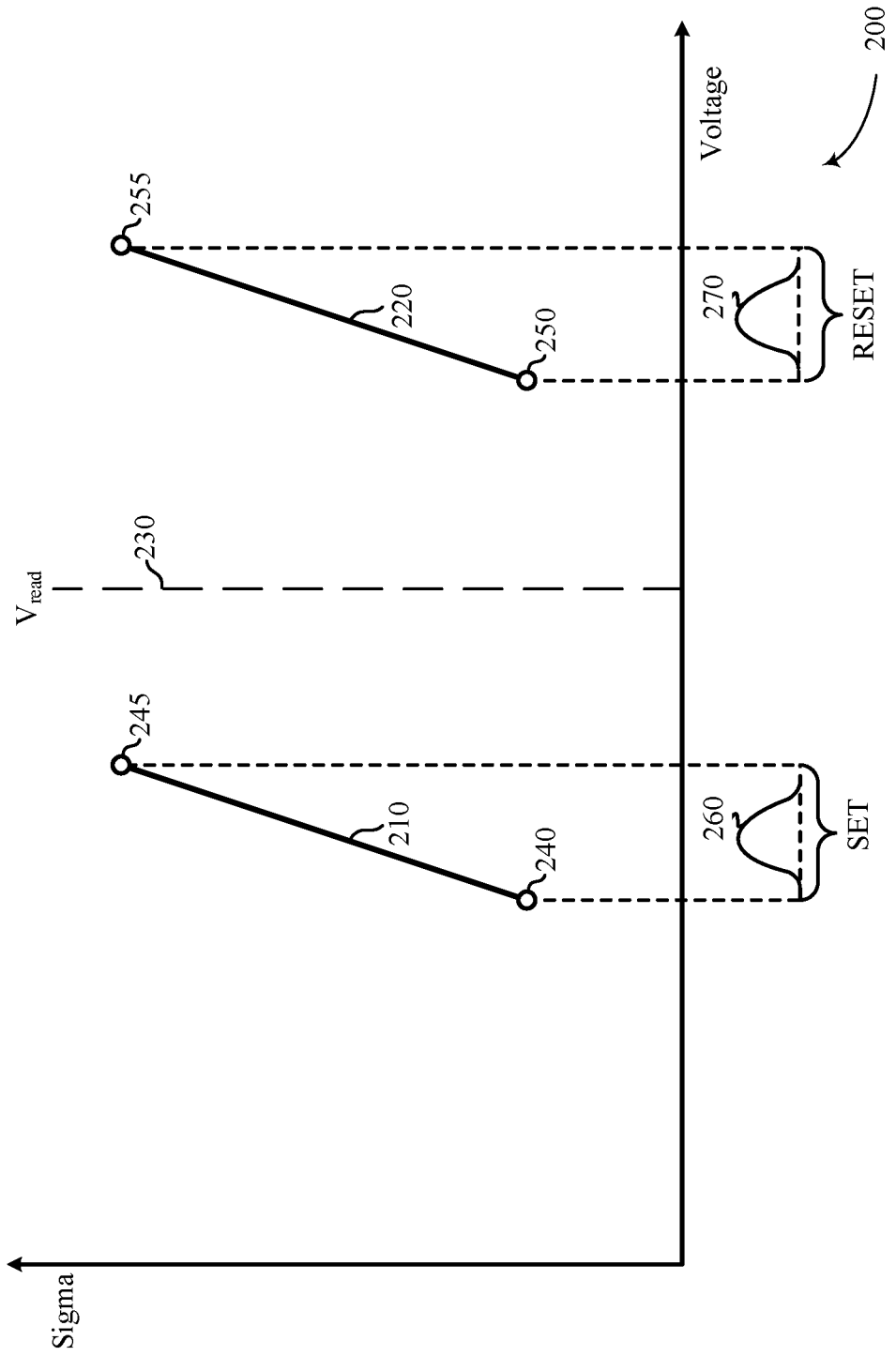
FIG. 2 illustrates a plot of threshold voltage ranges in a memory device in accordance with examples as disclosed herein.

FIG. 2 illustrates a plot 200 of threshold voltage ranges in a memory device 100 in accordance with examples as disclosed herein. The plot 200 may illustrate threshold voltage ranges of a representative population of memory cells 105 (e.g., a representative population of configurable material memory elements) of a memory device 100 with respect to the standard deviation, sigma.

The range 210 may illustrate a range of threshold voltages for the representative population of memory cells 105 when storing a first logic state or material state (e.g., a "SET" state). The range 210 may be associated with a lower boundary or edge (e.g., edge 240), which may be referred to as "E1," and an upper boundary or edge (e.g., edge 245), which may be referred to as "E2." Generally, the range 210 may span six standard deviations (e.g., six sigma), twelve standard deviations (e.g., twelve sigma), or a span between a minimum and maximum threshold voltage of the representative population of memory cells 105 when storing the SET state, although other range spans are possible without deviating from the scope of the present disclosure. Generally, the range 210 may be associated with a distribution 260, which may represent how many memory cells 105 have a particular threshold voltage along the range 210.

The range 220 may illustrate a range of threshold voltages for the representative population of memory cells 105 when storing a second logic state or material state (e.g., a "RESET" state). The range 220 may be associated with a lower boundary or edge (e.g., edge 250), which may be referred to as "E3," and an upper boundary or edge (e.g., edge 255), which may be referred to as "E4." The range 220 may span six standard deviations (e.g., six sigma), twelve standard deviations (e.g., twelve sigma), or a span between a minimum and maximum threshold voltage of the representative population of memory cells 105 when storing the RESET state, although range spans of other lengths are possible without deviating from the scope of the present disclosure. Generally, the range 220 may be associated with a distribution 270, which may represent how many memory cells 105 have a particular threshold voltage along the range 220. Generally, the distribution 260 or 270 may be or may approximate a gaussian distribution, a Poisson distribution, a binomial distribution, a uniform distribution, a Bernoulli distribution, a hypergeometric distribution, a log normal distribution, a chi-squared distribution, a gamma distribution, a beta distribution, an exponential distribution, a geometric distribution, a negative binomial distribution, a Weibull distribution, a binomial distribution, a linear distribution, or any other type of distribution.

The plot 200 also illustrates a read voltage 230 that may be used for detecting a logic state stored by the representative population of memory cells 105. For example, referring to the ranges 210 and 220, memory cells 105 of the representative population that store the SET state may permit a flow of current (e.g., a flow of current above a threshold amount of current) when applying the read voltage 230, because the read voltage 230 is above the threshold voltage for each of those memory cells 105 (e.g., because the range 210 is below the read voltage 230). In other words, memory cells 105 in the SET state will "threshold" in response to the read voltage 230 being applied. On the other hand, memory cells 105 of the representative population that store the RESET state may not permit a flow of current when applying the read voltage 230, or may permit some flow of current that is below a threshold (e.g., a leakage current) because the read voltage 230 is below the threshold voltage for each of those memory cells 105 (e.g., because the range 220 a is above the read voltage 230). In other words, memory cells 105 in the RESET state may not threshold in response to the read voltage 230 being applied. Thus, in some examples, the read voltage 230 may be referred to as, or otherwise be associated with a voltage demarcation (VDM), which may refer to a demarcation between the SET and RESET state for the representative population of memory cells 105.

Figure 3A:
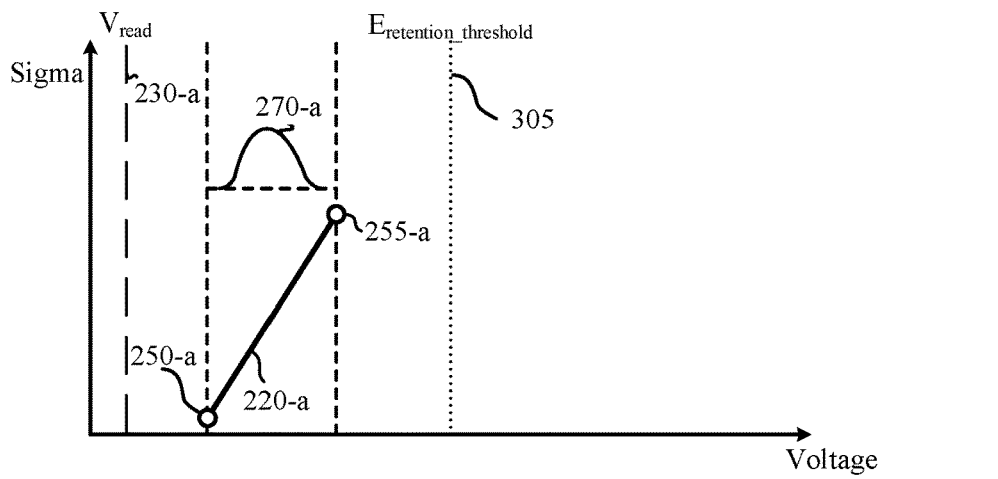
FIGS. 3A, 3B, and 3C illustrate an example of threshold voltage drift plots that support enhancing memory device performance in environments subject to power cycling in accordance with examples as disclosed herein.
Figure 3B:
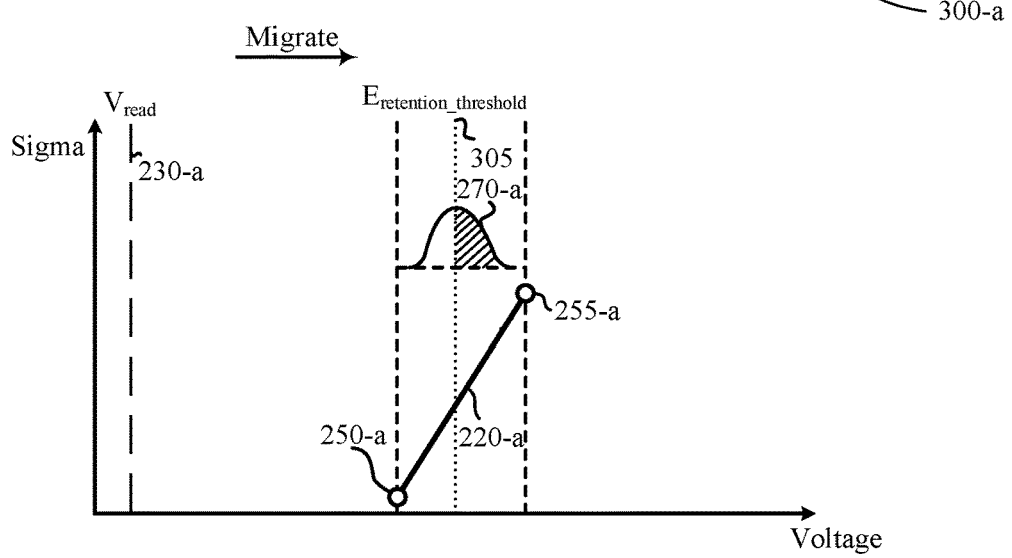
Figure 3C:
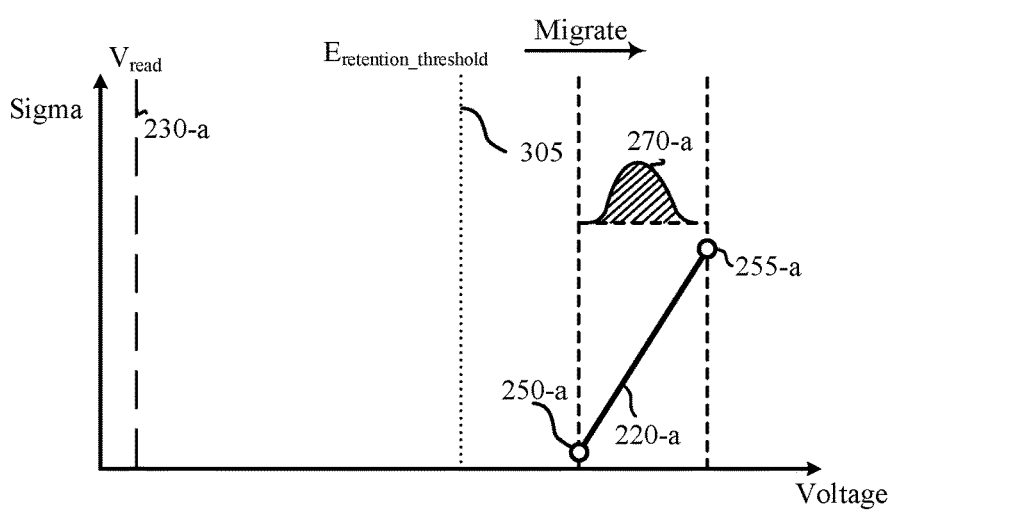

FIGS. 3A, 3B, and 3C illustrate examples of threshold voltage drift plots 300-a, 300-b, and 300-c that support enhancing memory device performance in environments subject to power cycling in accordance with examples as disclosed herein. In some examples, threshold voltage drift plots 300-a, 300-b, and 300-c may illustrate aspects of plot 200. For instance, threshold voltage drift plots 300 may include edges 250-a and 255-a, which may be examples of edges 250 and 255 as described with reference to FIG. 2. Additionally, threshold voltage drift plots 300-a, 300-b, and 300-c may include range 220-a, read voltage 230-a, and distribution 270-a, which may be examples of a range 220, read voltage 230, and distribution 270 as described with reference to FIG. 2. In general, plot 300-a may represent a position of range 220-a at a first time, plot 300-b may represent a position of range 220-a at a later time relative to plot 300-a, and plot 300-c may represent a position of range 220-a at a later time relative to plot 300-b.

The threshold voltage drift plots 300-a, 300-b, 300-c illustrate an example of threshold voltage drift over time for the memory device 100 of a representative population of memory cells 105 storing a RESET state, including when the memory device 100 is powered down. If the range increases too much (e.g., beyond $E_{retention\_threshold}$ 305), each memory cell 105 whose threshold voltage is above $E_{retention\_threshold}$ 305 may not be programmed to a SET state by write pulses typically used to program memory cells 105 to the SET state. Such memory cells 105 may regain the capability to be programmed to a SET state by undergoing one or more operations (e.g., programming with pulses of modified amplitude or width). However, if enough memory cells 105 have a threshold voltage above $E_{retention\_threshold}$ 305, the one or more operations involved in regaining the capability may involve using an excessive amount of power or time (e.g., may involve an amount of time that delays other operations that the memory device may perform).

For example, as illustrated in FIG. 3A, both edges 255-a and 250-a of range 220-a may initially be below $E_{retention\_threshold}$ 305. As such, the corresponding distribution 270-a may also be below $E_{retention\_threshold}$ 305 and each of the representative population of memory cells 105 may be programmable to a SET state. However, as shown in FIG. 3B, as time continues range 220-a, edges 255-a and 250-a, and distribution 270-a may shift to the right such that edge 255-a is above $E_{retention\_threshold}$ 305 and edge 250-a is below $E_{retention\_threshold}$ 305. In such cases, a portion of memory cells 105 in distribution 270-a may have threshold voltages above $E_{retention\_threshold}$ 305 and a portion of memory cells 105 in distribution 270-a may have threshold voltages below $E_{retention\_threshold}$ 305. If a threshold percentage of distribution 270-a or a threshold quantity of memory cells 105 have threshold voltages above $E_{retention\_threshold}$ 305, the energy or time associated with programming those memory cells to a SET state or lowering their threshold voltages below $E_{retention\_threshold}$ 305 may be greater than a capability of the memory device containing memory cells 105 or may delay the memory device from performing other operations. Eventually, as illustrated in FIG. 3C, range 210-a may shift enough that edges 255-a and 250-a as well as distribution 270-a are above $E_{retention\_threshold}$ 305. In such cases, even more energy or time may be involved in programming the memory cells 105 to a SET state or in enabling the memory cells 105 to regain the capability to be programmed to a SET state (e.g., in lowering the threshold voltage).

Figure 4:
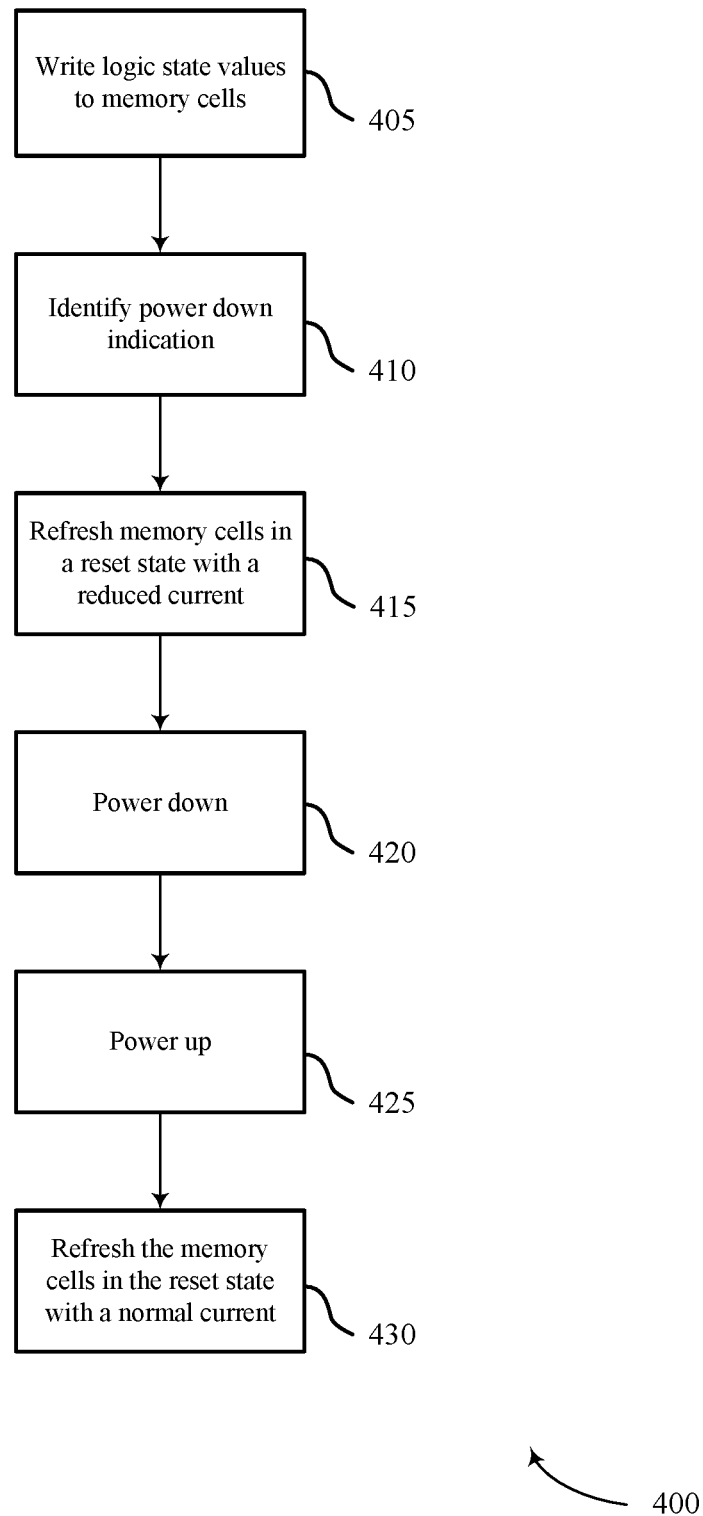
FIG. 4 illustrates an example of a process flow for enhancing memory device performance in environments subject to power cycling in accordance with examples as disclosed herein.

FIG. 4 illustrates an example of a process flow for enhancing memory device performance in environments subject to power cycling in accordance with examples as disclosed herein. FIGS. 5A, 5B, and 5C illustrate examples of write pulse operations 500-a, 500-b, and 500-c for enhancing memory device performance in environments subject to power cycling in accordance with examples of the present disclosure. Generally, process flow 400 may enable a memory device (e.g., a memory device 100) to lower or mitigate an increase of a threshold voltage of one or more memory cells 105 of a memory section 110 that are programmed in a RESET state. In some cases, process flow 400 may be performed when a frequency associated with powering the memory device off is below a threshold (e.g., at a low value).

At 405, the memory device may be powered on and may write memory cells 105 (e.g., during normal read/write operations) according to a set of parameters. For instance, as demonstrated in FIG. 5A, the memory device may apply a first write pulse 505 with an amplitude $I_{set}$ to a first set of the memory cells 105, which may program the memory cells to the SET state 515. Additionally, the memory device may apply a second write pulse 510-a with an amplitude $I_{reset1}$ to a second set of the memory cells 105, which may program the memory cells to a $I_{reset1}$ pulse RESET state 520. Generally, both the first write pulse 505 and the second write pulse 510-a may be associated with respective sets of parameters, which may include a predefined rise time of the pulse, a predefined fall time of the pulse, a predefined width of the pulse, a predefined amplitude of the pulse, a predefined shape of the pulse, or a combination thereof. Writing to the memory cells 105 may occur as single write operation or may occur over multiple write operations.

At 410, the memory device may identify or detect an indication of power down for the memory device. In one example, the memory device may identify the indication via received signaling (e.g., signaling received from a host device). Alternatively, the memory device may identify the indication based on a power level of the memory device satisfying a threshold (e.g., a supply voltage going below a threshold or going below a threshold for a certain period of time). In cases where power is removed by the host device without an indication that the power down is imminent, the memory device may switch to an alternative power source (e.g., backup power source or supercapacitor) to provide power on a temporary basis. That is, a secondary or back-up power source (e.g., back-up voltage source 185 in FIG. 1) or a capacitor (e.g., capacitor 190 in FIG. 1) may be coupled with the memory device and/or the memory section 110 of the memory device.

At 415, the memory device may refresh the memory cells 105 programmed to $I_{reset1}$ pulse RESET state 520 at 405. To determine which memory cells 105 are programmed to $I_{reset1}$ pulse RESET state 520, the memory device may perform a read on the memory cells 105. After determining which memory cells 105 are programmed to $I_{reset1}$ pulse RESET state 520, the memory device may perform the refresh as demonstrated with regards to FIG. 5B by applying a write pulse 510-b with an amplitude $I_{reset2}$ to those memory cells 105. Upon applying write pulse 510-b, those memory cells 105 may be programmed to $I_{reset2}$ pulse RESET state 525. In some cases, the value of $I_{reset2}$ may depend on one or more physical characteristics, such as a temperature of the memory device or of any one of its components.

At 420, the memory device may be powered down. Powering down may involve removing or isolating the memory device and/or the memory section 110 of the memory device from a supply voltage source (e.g., supply voltage source 175 in FIG. 1). Alternatively, powering down may involve deactivating the supply voltage source. In some cases, powering down of the memory device at 420 may be performed without a specific action on the part of the memory device (e.g., the supply voltage is powered down). The gap in time between 415 and 420 may enable the memory device to have sufficient time to refresh the memory cells at 415 before powering down at 420.

In some cases, the memory device may be powered down before refreshing the memory cells 105. In such cases, the memory device may be coupled with a secondary supply (e.g., back-up voltage source 185 or capacitor 190), which may also be known as a temporary power source, prior to, upon, or after power down. Alternatively, the secondary supply may be activated prior to, upon, or after power down. In either case, the secondary supply may provide enough power to the memory device to enable the memory device to refresh the memory cells 105 programmed to $I_{reset1}$ pulse RESET state 520 with write pulse 510-b, such as described at 415.

At 425, the memory device may power up. Powering up may involve restoring or coupling the memory device and/or the memory section 110 of the memory device with a supply voltage source. Alternatively, powering up may involve reactivating the supply voltage source. Before or while being powered up, the memory device may decouple the back-up power source or capacitor from the memory device and/or the memory section 110 of the memory device.

At 430, the memory device may determine which memory cells 105 are programmed to $I_{reset2}$ pulse RESET state 525 (e.g., by performing one or more read operations) and may refresh those memory cells 105. The memory device may perform the refresh as demonstrated with reference to FIG. 5C by applying write pulse 510-a with an amplitude $I_{reset1}$ to those memory cells 105, which may program those memory cells to $I_{reset1}$ pulse RESET state 520.

Generally, programming with write pulse 510-b before powering down at 420 and programming with write pulse 510-a after powering up may shift the voltage threshold of those memory cells 105 down or may mitigate the amount that the voltage threshold shifts up. Shifting the voltage threshold down or mitigating the shift up may altogether prevent the voltage thresholds of the memory cells 105 from passing $E_{retention\_threshold}$ 305 or may at least increase a time (e.g., an E4 retention time) before the voltage thresholds of the memory cells 105 pass $E_{retention\_threshold}$ 305.

Figure 6:
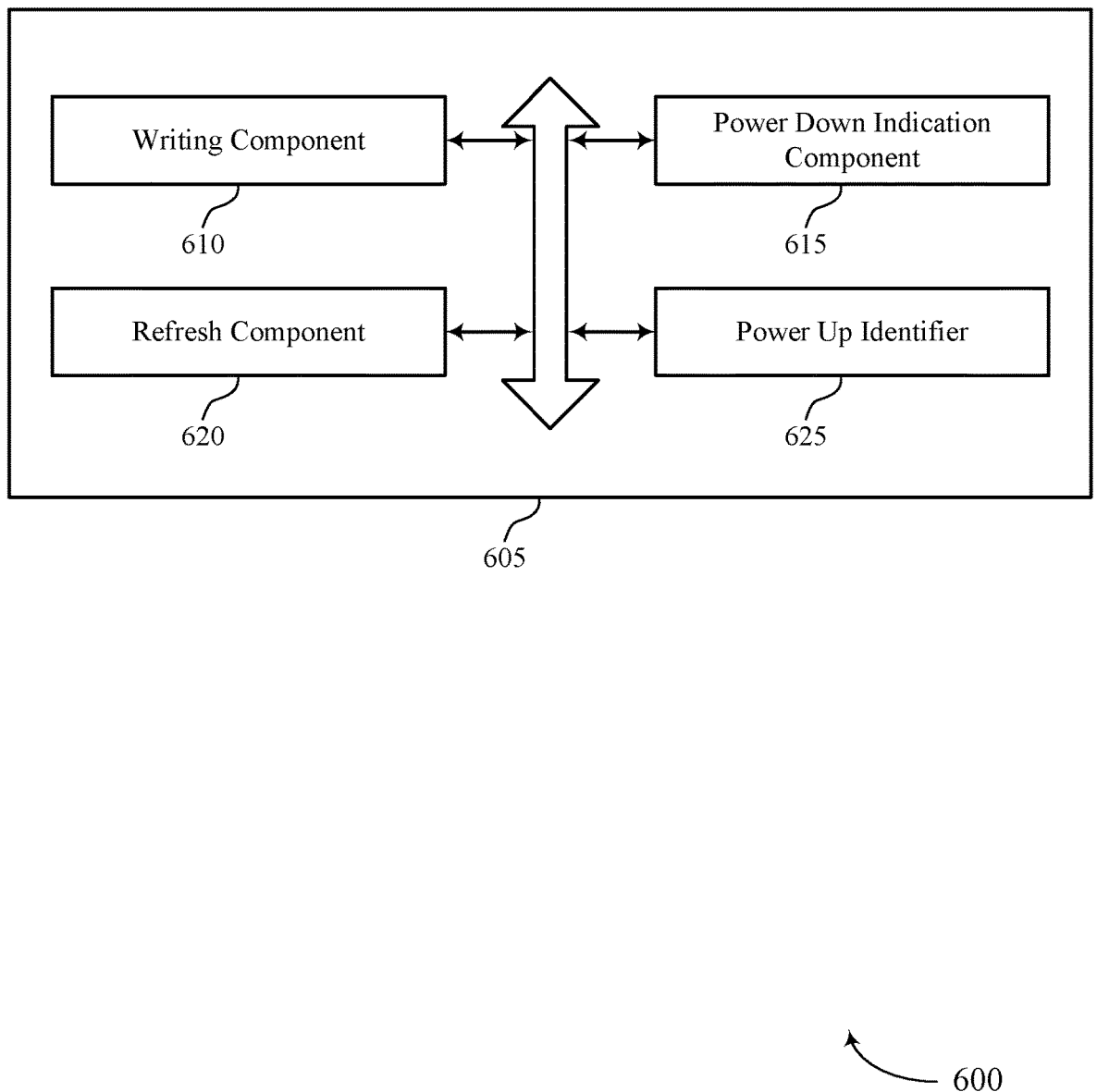
FIG. 6 shows a block diagram of a memory device in accordance with example as disclosed herein.

FIG. 6 shows a block diagram 600 of a memory device 605 that supports enhancing memory device performance in environments subject to power cycling in accordance with examples as disclosed herein. The memory device 605 may be an example of a memory device 100 or one or more of its components as described with reference to FIG. 1. The memory device 605 may include a writing component 610, a power down indication component 615, a refresh component 620, and a power up identifier 625. Each of these modules may communicate, directly or indirectly, with one another (e.g., via one or more buses).

The writing component 610 may write a set of memory cells of a device according to one or more parameters, where each of the set of memory cells is associated with a storage element storing a value based on a material property associated with the storage element.

In some cases, the one or more parameters includes a first reset current and the modified at least one of the one or more parameters includes a second reset current that is lower than the first reset current.

In some cases, each storage element of the set of memory cells includes a configurable material.

The power down indication component 615 may identify, after writing the set of memory cells, an indication of power down for the device.

In some examples, the power down indication component 615 may receive the indication of the power down for the device, where identifying the indication of the power down for the device is based on receiving the indication of the power down for the device.

In some examples, identifying the indication of the power down for the device includes identifying that a power level of the device satisfies a threshold.

The refresh component 620 may refresh, before the power down of the device, at least a subset of the set of memory cells based on identifying the indication of the power down for the device, where the refreshing includes modifying at least one of the one or more parameters for a write operation for the at least the subset of the set of memory cells.

In some examples, refreshing the at least the subset of the set of memory cells based on identifying the power up of the device, where the refreshing includes writing the at least the subset of the set of memory cells according to the one or more parameters.

In some examples, refreshing the at least the subset of the set of memory cells includes suppressing writing of memory cells of the set of memory cells having corresponding values associated with a second state.

In some examples, the refresh component 620 may modify the at least one of the one or more parameters for the write operation is based on a temperature of the device.

In some cases, the at least the subset of the set of memory cells include memory cells of the set of memory cells having corresponding values associated with a first state.

In some cases, the first state corresponds to a reset state.

The power up identifier 625 may identify a power up of the device after the power down of the device.

Figure 7:
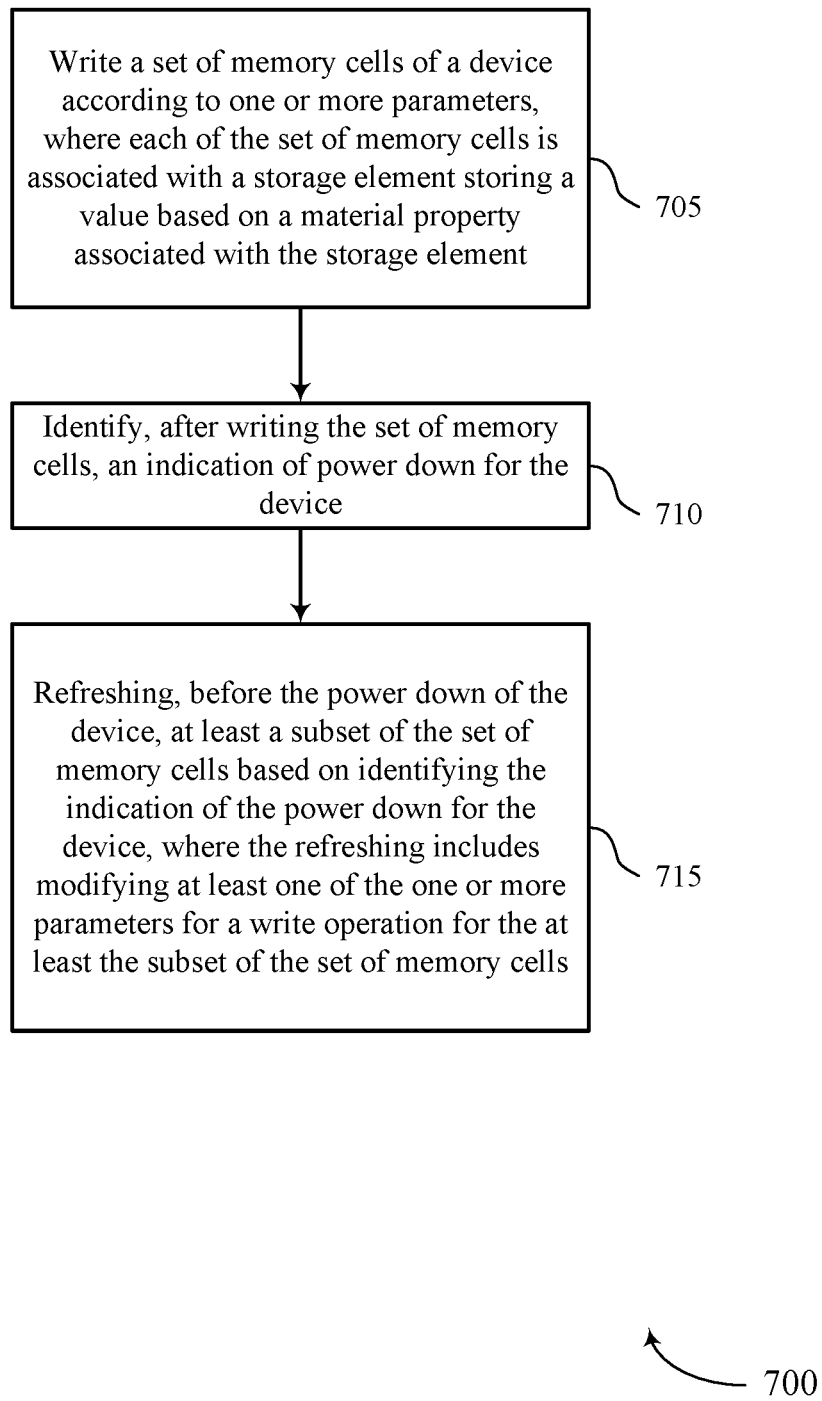
FIGS. 7 through 9 show flowcharts illustrating a method or methods in accordance with examples as disclosed herein.

FIG. 7 shows a flowchart illustrating a method 700 that supports enhancing memory device performance in environments subject to power cycling in accordance with examples as disclosed herein. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform at least a portion the described functions using special-purpose hardware.

At 705, the memory device may write a set of memory cells of a device according to one or more parameters, where each of the set of memory cells is associated with a storage element storing a value based on a material property associated with the storage element. The operations of 705 may be performed according to the methods described herein. In some examples, at least a portion of the operations of 705 may be performed by a writing component as described with reference to FIG. 6.

At 710, the memory device may identify, after writing the set of memory cells, an indication of power down for the device. The operations of 710 may be performed according to the methods described herein. In some examples, at least a portion of the operations of 710 may be performed by a power down indication component as described with reference to FIG. 6.

At 715, the memory device may refresh, before the power down of the device, at least a subset of the set of memory cells based on identifying the indication of the power down for the device, where the refreshing includes modifying at least one of the one or more parameters for a write operation for the at least the subset of the set of memory cells. The operations of 715 may be performed according to the methods described herein. In some examples, at least a portion of the operations of 715 may be performed by a refresh component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for writing a set of memory cells of a device according to one or more parameters, where each of the set of memory cells is associated with a storage element storing a value based on a material property associated with the storage element, identifying, after writing the set of memory cells, an indication of power down for the device, and refreshing, before the power down of the device, at least a subset of the set of memory cells based on identifying the indication of the power down for the device, where the refreshing includes modifying at least one of the one or more parameters for a write operation for the at least the subset of the set of memory cells.

Some examples of the method 700 and the apparatus described herein may further include operations, features, means, or instructions for identifying a power up of the device after the power down of the device, and refreshing the at least the subset of the set of memory cells based on identifying the power up of the device, where the refreshing includes writing the at least the subset of the set of memory cells according to the one or more parameters.

In some examples of the method 700 and the apparatus described herein, the one or more parameters includes a first reset current and the modified at least one of the one or more parameters includes a second reset current that may be lower than the first reset current.

Some examples of the method 700 and the apparatus described herein may further include operations, features, means, or instructions for receiving the indication of the power down for the device, where identifying the indication of the power down for the device may be based on receiving the indication of the power down for the device.

In some examples of the method 700 and the apparatus described herein, identifying the indication of the power down for the device may include operations, features, means, or instructions for identifying that a power level of the device satisfies a threshold.

In some examples of the method 700 and the apparatus described herein, the at least the subset of the set of memory cells include memory cells of the set of memory cells having corresponding values associated with a first state.

In some examples of the method 700 and the apparatus described herein, the first state corresponds to a reset state.

In some examples of the method 700 and the apparatus described herein, refreshing the at least the subset of the set of memory cells may include operations, features, means, or instructions for suppressing writing of memory cells of the set of memory cells having corresponding values associated with a second state.

In some examples of the method 700 and the apparatus described herein, each storage element of the set of memory cells includes a configurable material.

Some examples of the method 700 and the apparatus described herein may further include operations, features, means, or instructions for modifying the at least one of the one or more parameters for the write operation may be based on a temperature of the device.

Figure 8:
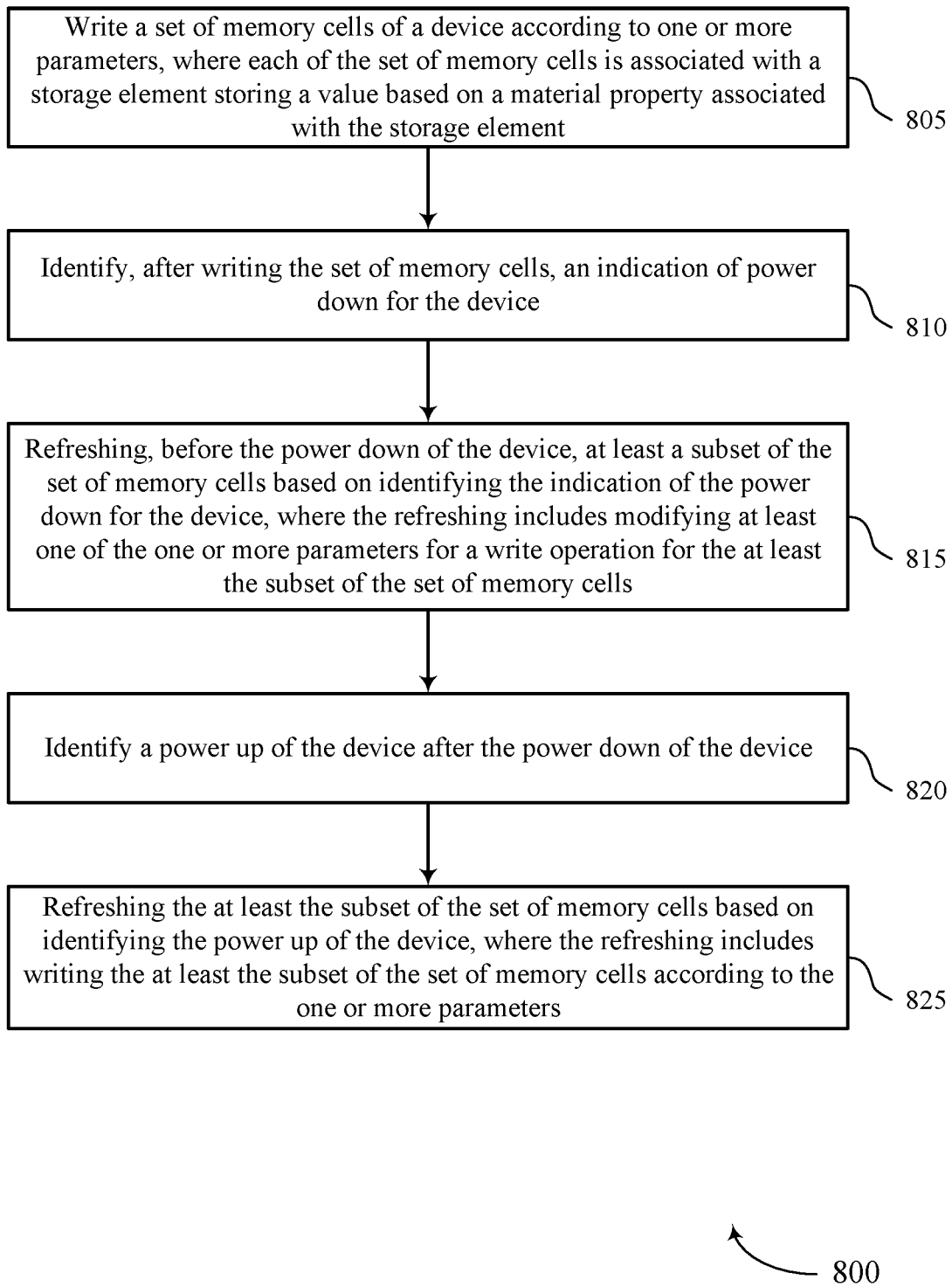

FIG. 8 shows a flowchart illustrating a method 800 that supports enhancing memory device performance in environments subject to power cycling in accordance with examples as disclosed herein. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform at least a portion of the described functions using special-purpose hardware.

At 805, the memory device may write a set of memory cells of a device according to one or more parameters, where each of the set of memory cells is associated with a storage element storing a value based on a material property associated with the storage element. The operations of 805 may be performed according to the methods described herein. In some examples, at least a portion of the operations of 805 may be performed by a writing component as described with reference to FIG. 6.

At 810, the memory device may identify, after writing the set of memory cells, an indication of power down for the device. The operations of 810 may be performed according to the methods described herein. In some examples, at least a portion of the operations of 810 may be performed by a power down indication component as described with reference to FIG. 6.

At 815, the memory device may refresh, before the power down of the device, at least a subset of the set of memory cells based on identifying the indication of the power down for the device, where the refreshing includes modifying at least one of the one or more parameters for a write operation for the at least the subset of the set of memory cells. The operations of 815 may be performed according to the methods described herein. In some examples, at least a portion of the operations of 815 may be performed by a refresh component as described with reference to FIG. 6.

At 820, the memory device may identify a power up of the device after the power down of the device. The operations of 820 may be performed according to the methods described herein. In some examples, at least a portion of the operations of 820 may be performed by a power up identifier as described with reference to FIG. 6.

At 825, the memory device may refresh the at least the subset of the set of memory cells based on identifying the power up of the device, where the refreshing includes writing the at least the subset of the set of memory cells according to the one or more parameters. The operations of 825 may be performed according to the methods described herein. In some examples, at least a portion of the operations of 825 may be performed by a refresh component as described with reference to FIG. 6.

Figure 9:
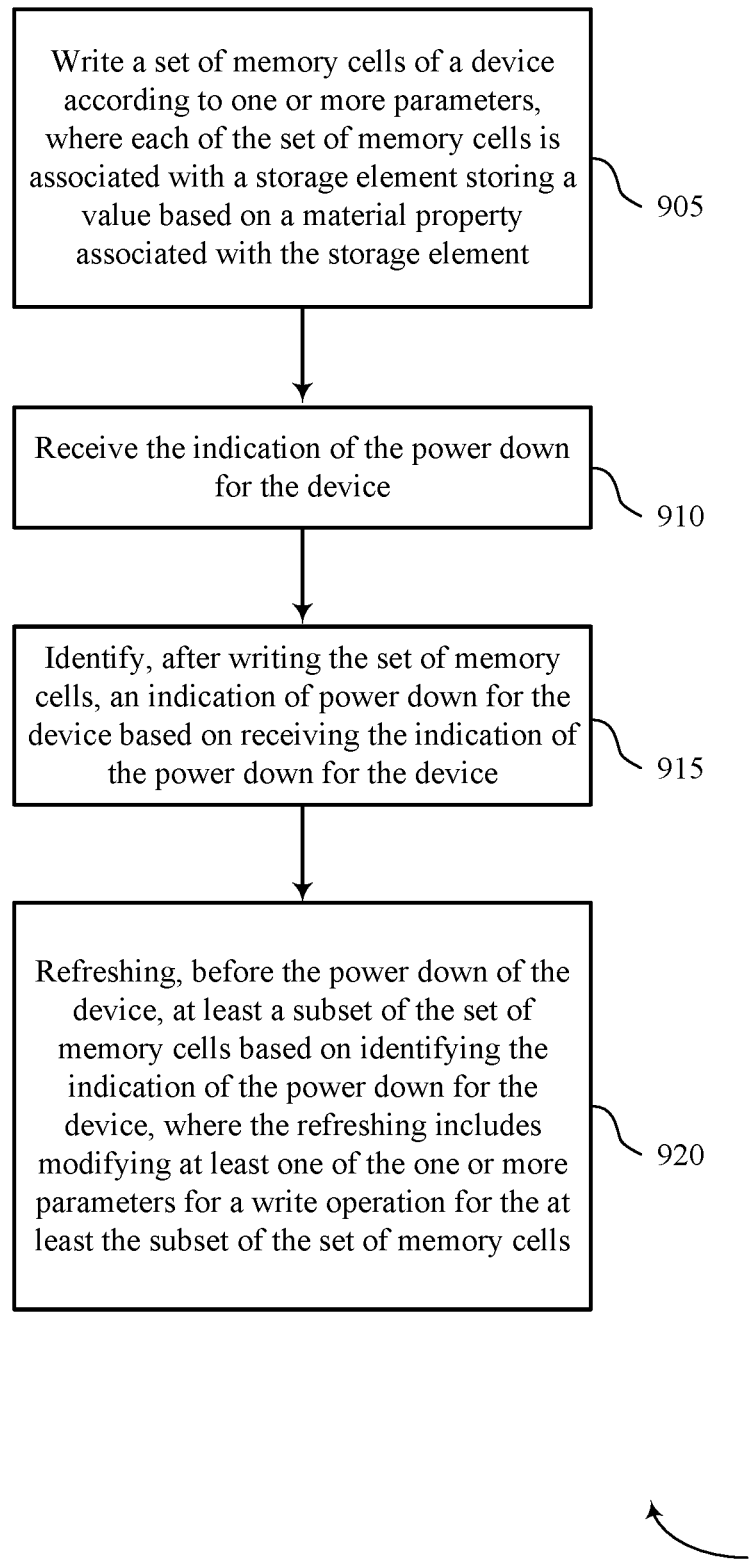

FIG. 9 shows a flowchart illustrating a method 900 that supports enhancing memory device performance in environments subject to power cycling in accordance with examples as disclosed herein. The operations of method 900 may be implemented by a memory device or its components as described herein. For example, the operations of method 900 may be performed by a memory device as described with reference to FIG. 6. In some examples, a memory device may execute a set of instructions to control the functional elements of the memory device to perform the described functions. Additionally or alternatively, a memory device may perform at least a portion of the described functions using special-purpose hardware.

At 905, the memory device may write a set of memory cells of a device according to one or more parameters, where each of the set of memory cells is associated with a storage element storing a value based on a material property associated with the storage element. The operations of 905 may be performed according to the methods described herein. In some examples, at least a portion of the operations of 905 may be performed by a writing component as described with reference to FIG. 6.

At 910, the memory device may receive the indication of the power down for the device. The operations of 910 may be performed according to the methods described herein. In some examples, at least a portion of the operations of 910 may be performed by a power down indication component as described with reference to FIG. 6.

At 915, the memory device may identify, after writing the set of memory cells, an indication of power down for the device based on receiving the indication of the power down for the device. The operations of 915 may be performed according to the methods described herein. In some examples, at least a portion of the operations of 915 may be performed by a power down indication component as described with reference to FIG. 6.

At 920, the memory device may refresh, before the power down of the device, at least a subset of the set of memory cells based on identifying the indication of the power down for the device, where the refreshing includes modifying at least one of the one or more parameters for a write operation for the at least the subset of the set of memory cells. The operations of 920 may be performed according to the methods described herein. In some examples, at least a portion of the operations of 920 may be performed by a refresh component as described with reference to FIG. 6.

It should be noted that the methods described above describe possible implementations, and that the operations and the steps may be rearranged or otherwise modified and that other implementations are possible. Further, portions from two or more of the methods may be combined.

An apparatus is described. The apparatus may include a memory array including a set of memory cells that each include a storage element storing a value based on a material property associated with the storage element, a circuit coupled with the memory array and configured to receive access commands for the memory array and to perform write operations to the set of memory cells according to a first parameter based on the access commands, and a controller coupled with the memory array and configured to identify an indication that a supply voltage for the memory array will be removed and to refresh at least a subset of the set of memory cells before the removal of the supply voltage based on identifying the indication, where the refreshing includes performing write operations to the at least the subset of the set of memory cells according to a second parameter.

In some examples, the controller may be further configured to identify that the supply voltage may be restored after the removal of the supply voltage and to refresh the at least the subset of the set of memory cells based on identifying that the supply voltage may be restored, where the refreshing includes performing write operations to the at least the subset of the set of memory cells according to the first parameter.

In some examples, the first parameter includes a first current for storing a first logic state and the second parameter includes a second current for storing the first logic state that may be different than the first current.

In some examples, the controller may be configured to identify the indication of removal of the supply voltage for the memory array based on receiving signaling indicating the removal of the supply voltage for the memory array.

In some examples, the controller may be configured to identify the indication of removal of the supply voltage for the memory array based on detecting that the supply voltage satisfies a threshold.

In some examples, the at least the subset of the set of memory cells include memory cells of the set of memory cells having corresponding values associated with a first state. In some examples, the first state corresponds to a first material state.

In some examples, the refreshing includes suppressing writing of memory cells of the set of memory cells having corresponding values associated with a second state.

In some examples, each memory cell of the set of memory cells may be a phase change memory (PCM) memory cell or a chalcogenide memory cell.

Some examples of the apparatus may include a capacitor coupled with the memory array and configured to maintain power for the memory array after the removal of the supply voltage.

Some examples of the apparatus may include a back-up power source configured to be selectively coupled with the memory array after the removal of the supply voltage.

An apparatus is described. The apparatus may include a memory array including a set of memory cells each associated with a storage element storing a value based on a change in a material property associated with the storage element, a control unit in electronic communication with the memory array and operable to, identify an indication of power down for the memory array, read, before the power down of the memory array, the set of memory cells to identify the first subset of memory cells of the set of memory cells having the first state, and write, after the read and before the power down of the memory array, the first subset of memory cells by applying a third signal to the first subset of memory cells.

Some examples may further include identifying a power up of the memory array after the power down of the memory array, read, after the power up of the memory array, the set of memory cells to identify the first subset of memory cells having the first state, and write, after the power up and the read, the first subset of memory cells by applying the first signal to the first subset of memory cells.

In some examples, the first signal includes a first current and the third signal includes a second current that may be lower than the first current.

In some examples, each storage element of the set of memory cells includes a phase change material or a chalcogenide material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   writing a plurality of memory cells of a device according to one or more parameters, wherein each of the plurality of memory cells is associated with a storage element storing a value based at least in part on a material property associated with the storage element;
   modifying at least one of the one or more parameters for a write operation for at least a subset of the plurality of memory cells, wherein the at least one of the one or more parameters is associated with a first value before the modifying and a second value after the modifying;
   refreshing the at least the subset of the plurality of memory cells based at least in part on modifying the at least one of the one or more parameters;
   adjusting a threshold voltage of the at least the subset of the plurality of memory cells based at least in part refreshing the at least the subset of the plurality of memory cells and the second value of the modified at least one of the one or more parameters; and
   writing the plurality of memory cells of the device according to the first value of the at least one of the one or more parameters after refreshing the at least the subset of the plurality of memory cells according to the second value of the modified at least one of the one or more parameters.

2. The method of claim 1, wherein the one or more parameters comprises a first reset current and the modified at least one of the one or more parameters comprises a second reset current that is lower than the first reset current.

3. The method of claim 1, further comprising:
   modifying the at least one of the one or more parameters from the second value to the first value based at least in part on adjusting the threshold voltage.

4. The method of claim 1, wherein the at least one of the one or more parameters is associated with a first value before the modifying and is associated with a second value after the modifying that is less than the first value, wherein adjusting the threshold voltage is based at least in part on the second value.

5. The method of claim 1, wherein the at least the subset of the plurality of memory cells comprise memory cells of the plurality of memory cells having corresponding values associated with a first state.

6. The method of claim 5, wherein the first state corresponds to a reset state.

7. The method of claim 5, wherein:
   refreshing the at least the subset of the plurality of memory cells comprises suppressing writing of memory cells of the plurality of memory cells having corresponding values associated with a second state.

8. The method of claim 1, wherein each storage element of the plurality of memory cells comprises a configurable material.

9. The method of claim 1, wherein:
modifying the at least one of the one or more parameters for the write operation is based at least in part on a temperature of the device.

10. A method, comprising:
writing a plurality of memory cells of a device according to one or more parameters, wherein each of the plurality of memory cells is associated with a storage element storing a value based at least in part on a material property associated with the storage element;
modifying at least one of the one or more parameters for a write operation for at least a subset of the plurality of memory cells, wherein the at least one of the one or more parameters is associated with a first value before the modifying and a second value after the modifying;
refreshing the at least the subset of the plurality of memory cells based at least in part on modifying the at least one of the one or more parameters;
adjusting a threshold voltage of the at least the subset of the plurality of memory cells based at least in part refreshing the at least the subset of the plurality of memory cells and the modified at least one of the one or more parameters;
identifying a power up of the device; and
refreshing, after adjusting the threshold voltage of the at least the subset of the plurality of memory cells, the at least the subset of the plurality of memory cells according to the first value of the at least one of the one or more parameters based at least in part on identifying the power up of the device.

11. An apparatus, comprising:
a memory array comprising a plurality of memory cells that each comprise a storage element configured to store a value based at least in part on a material property associated with the storage element;
a circuit coupled with the memory array and configured to receive access commands for the memory array and to perform write operations to the plurality of memory cells according to a first parameter based at least in part on the access commands; and
a controller coupled with the memory array and configured to refresh at least a subset of the plurality of memory cells according to a second parameter and to adjust a threshold voltage of the at least the subset of the plurality of memory cells based at least in part on refreshing the at least the subset of the plurality of memory cells, wherein the controller is further configured to write the plurality of memory cells according to the first parameter after refreshing the at least the subset of the plurality of memory cells according to the second parameter.

12. The apparatus of claim 11, wherein the first parameter comprises a first current for storing a first logic state and the second parameter comprises a second current for storing the first logic state that is different than the first current.

13. The apparatus of claim 11, wherein the first parameter is associated with a first value that is higher than a second value of the second parameter, and the controller is configured to reduce the threshold voltage based at least in part on the first value being higher than the second value.

14. The apparatus of claim 11, wherein the at least the subset of the plurality of memory cells comprise memory cells of the plurality of memory cells configured to have corresponding values associated with a first state.

15. The apparatus of claim 14, wherein the first state corresponds to a first material state.

16. An apparatus, comprising:
a memory array comprising a plurality of memory cells that each comprise a storage element configured to store a value based at least in part on a material property associated with the storage element;
a circuit coupled with the memory array and configured to receive access commands for the memory array and to perform write operations to the plurality of memory cells according to a first parameter based at least in part on the access commands; and
a controller coupled with the memory array and configured to refresh at least a subset of the plurality of memory cells according to a second parameter and to adjust a threshold voltage of the at least the subset of the plurality of memory cells based at least in part on refreshing the at least the subset of the plurality of memory cells, wherein the controller is further configured to identify that a supply voltage is activated and to refresh the at least the subset of the plurality of memory cells according to the first parameter after adjusting the threshold voltage of the at least the subset of the plurality of memory cells.

17. An apparatus, comprising:
a memory array comprising a plurality of memory cells that each comprise a storage element configured to store a value based at least in part on a material property associated with the storage element;
a circuit coupled with the memory array and configured to receive access commands for the memory array and to perform write operations to the plurality of memory cells according to a first parameter based at least in part on the access commands; and
a controller coupled with the memory array and configured to refresh at least a subset of the plurality of memory cells, wherein the at least the subset of the plurality of memory cells comprise memory cells of the plurality of memory cells having corresponding values associated with a first state, and wherein the refreshing comprises performing write operations to the at least the subset of the plurality of memory cells according to a second parameter and refraining from writing of memory cells of the plurality of memory cells having corresponding values associated with a second state, wherein the controller is further configured to write the plurality of memory cells according to the first parameter after refreshing the at least the subset of the plurality of memory cells according to the second parameter.

18. The apparatus of claim 17, wherein the controller is further configured to adjust a threshold voltage of the at least the subset of the plurality of memory cells based at least in part on refreshing the at least the subset of the plurality of memory cells according to the second parameter.

19. The apparatus of claim 17, wherein the first parameter is associated with a first value that is higher than a second value of the second parameter, and the controller is configured to reduce a threshold voltage of the subset of the plurality of memory cells based at least in part on the first value being higher than the second value.

20. The apparatus of claim 17, wherein the controller is configured to determine the second parameter based at least in part on a temperature of the apparatus.

21. The apparatus of claim 17, wherein each memory cell of the plurality of memory cells is a phase change memory (PCM) memory cell or a chalcogenide memory cell.

22. An apparatus, comprising:
a memory array comprising a plurality of memory cells that each comprise a storage element configured to store a value based at least in part on a material property associated with the storage element;

a circuit coupled with the memory array and configured to receive access commands for the memory array and to perform write operations to the plurality of memory cells according to a first parameter based at least in part on the access commands; and a controller coupled with the memory array and configured to refresh at least a subset of the plurality of memory cells, wherein the at least the subset of the plurality of memory cells comprise memory cells of the plurality of memory cells having corresponding values associated with a first state, and wherein the refreshing comprises performing write operations to the at least the subset of the plurality of memory cells according to a second parameter and refraining from writing of memory cells of the plurality of memory cells having corresponding values associated with a second state, wherein the controller is further configured to identify that a supply voltage is activated and to refresh the at least the subset of the plurality of memory cells according to the first parameter after refreshing the at least the subset of the plurality of memory cells.

23. The apparatus of claim 22, wherein the first parameter comprises a first current for storing the first state and the second parameter comprises a second current for storing the first state that is different than the first current.

* * * * *